United States Patent
Lefeber

(10) Patent No.: US 9,581,646 B2
(45) Date of Patent: Feb. 28, 2017

(54) ELECTRICAL ARC DETECTION IN ELECTRICAL SWITCHING DEVICES

(71) Applicant: Waukesha Electric Systems, Inc., Waukesha, WI (US)

(72) Inventor: Paul Lefeber, Franklin, WI (US)

(73) Assignee: WAUKESHA ELECTRIC SYSTEMS, INC., Waukesha, WI (US)

( * ) Notice: Subject to any disclaimer, the term of this patent is extended or adjusted under 35 U.S.C. 154(b) by 358 days.

(21) Appl. No.: 14/215,643

(22) Filed: Mar. 17, 2014

(65) Prior Publication Data
US 2014/0265635 A1 Sep. 18, 2014

Related U.S. Application Data

(60) Provisional application No. 61/792,177, filed on Mar. 15, 2013.

(51) Int. Cl.
*H02H 3/00* (2006.01)
*G01R 31/327* (2006.01)
*G01R 31/12* (2006.01)
*H02H 1/00* (2006.01)

(52) U.S. Cl.
CPC ....... *G01R 31/3274* (2013.01); *G01R 31/1218* (2013.01); *H02H 1/0015* (2013.01); *H02H 1/0023* (2013.01); *Y10T 307/773* (2015.04)

(58) Field of Classification Search
USPC ............................................ 361/2, 7, 42, 44
See application file for complete search history.

(56) References Cited

U.S. PATENT DOCUMENTS

| | | | | |
|---|---|---|---|---|
| 2008/0170344 A1* | 7/2008 | Byron | .................. | H02H 1/0015 361/63 |
| 2008/0192389 A1* | 8/2008 | Muench | ............... | H02H 1/0023 361/5 |
| 2009/0161272 A1* | 6/2009 | Asokan | ................ | G01R 31/088 361/43 |
| 2010/0073831 A1* | 3/2010 | Schweitzer, III | .. | G01R 31/1218 361/42 |

\* cited by examiner

*Primary Examiner* — Danny Nguyen
(74) *Attorney, Agent, or Firm* — Baker Hostetler LLP

(57) ABSTRACT

An electrical arc detector for switchgear includes a fiber-optic cable configured to receive light emitted from switchgear at a first end and transport the light to a second end. The detector further includes a sensor arranged adjacent the second end of the fiber-optic cable configured to sense the light and generate an electrical signal, and analog-to-digital converter configured to convert the electrical signal to a digital signal, and a processor configured to monitor the digital signal and at least one of transmit information related to the digital signal, store information related to the digital signal, and take action based on the digital signal.

20 Claims, 5 Drawing Sheets

ELECTRICAL ARC DETECTION IN ELECTRICAL SWITCHING DEVICES

RELATED APPLICATIONS

This application is a non-provisional filing of U.S. Provisional Application Ser. No. 61/792,177, filed on Mar. 15, 2013.

FIELD OF THE INVENTION

The invention relates generally to a system and method for detecting problems in electrical switching devices. In particular, the problem detection system and method suited to detect problems in load tap changers, relays, and other switchgear components in electrical switching devices implementing vacuum interrupters.

BACKGROUND OF THE INVENTION

Electrical power transformers, such as those used in facilities known as substations, use power at substantial voltages and currents, typically lowering the voltage drawn from long distance transmission lines and providing power to local distribution circuits and/or industrial customers. An electrical power transformer can support a power load which can be drawn from an area including said local distribution circuits and/or industrial customers, including for example factories, apartment buildings, housing developments, and the like, in turn located in the vicinity of the substations. Depending on the loads, electrical power transformers can be positioned to cover a power grid with comparable transformers used at power plants and other facilities to step up voltage to levels suitable for application to the long distance transmission lines.

Load current variations in power distribution systems affect voltage drops across both customer load impedances and distribution system elements. These voltage changes require compensating adjustments in transformer winding connections ("taps") to maintain the available voltage at the loads within prescribed limits, with the intent of maintaining as close to a constant voltage as practicable at each distributed load. It is known in power distribution apparatus to include, with the requisite multi-tap power transformers, automatically controlled load tap changers (LTCs) that can adjust the voltage at which power is fed to large loads, typically several times per day but as often as hundreds of times per day. The tap changes can be made without interrupting the load current in some embodiments, hence the term "load tap changer."

By physically moving its tap positions, a load tap changer (LTC) switches an energized transformer turn ratio to compensate for changes in voltages on the supply end of the transformer. Original LTC designs switched contacts were immersed in oil. The movement from tap to tap created an arc and these units were known as arcing in oil tap changers. Arcing in oil decreases oil quality and contact life cycle or duration. The use of vacuum interruption during switching began a few decades ago and its use is increasing with greater customer acceptance. However, these vacuum interruption devices do not have effective monitoring systems.

Accordingly, a monitoring system is needed to protect the equipment and system in the unlikely event of a bottle system failure.

SUMMARY OF THE INVENTION

The foregoing needs are met, to a great extent, by the present invention, wherein in one aspect a detector can detect unintended electrical arcing in electrical switching devices that utilize vacuum interrupters.

According to some aspects of the disclosure, an electrical arc detection system for switchgear is disclosed. The electrical arc detection system including: a fiber-optic cable positioned to receive light emitted by a vacuum interrupter towards an insulating fluid in which the vacuum interrupter is immersed in; wherein, the light emission results from arcing of the vacuum interrupter and it is received by a section of the fiber-optic cable that is proximate to the light emission, and the section of the fiber-optic cable receiving the light emission carrying the light towards one or more sensors in communication with a processor. The one or more sensors configured to sense the light and generate an electrical signal and an analog-to-digital converter configured to convert the electrical signal to a digital signal. The processor configured to receive the signal and, based on the digital signal, at least one of transmit information related to the digital signal, store information related to the digital signal, and take action based on the digital signal.

In accordance with additional aspects, the electrical arc detector for switchgear can include a fiber-optic cable configured to receive light emitted from switchgear at a first end and transport the light to a second end. The detector further includes a sensor arranged adjacent the second end of the fiber-optic cable configured to sense the light and generate an electrical signal, and analog-to-digital converter configured to convert the electrical signal to a digital signal, and a processor configured to monitor the digital signal and at least one of transmit information related to the digital signal, store information related to the digital signal, and take action based on the digital signal.

In yet additional aspects, a method of detecting arcing in electrical switching devices implementing one or more vacuum interrupters is disclosed. The method comprising: providing an electrical arc detection system, the electrical detection system including one or more light sensors to detect a visible electrical arc; the providing step further comprising, configuring the one or more light sensors to be in communication with a controller; determining the severity of an event based on a sensor signal sent to the controller; and executing a predetermined action based on the severity of the event.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the invention. It is important, therefore, that the claims be regarded as including such equivalent constructions insofar as they do not depart from the spirit and scope of the invention.

DETAILED DESCRIPTION

Figure 1:
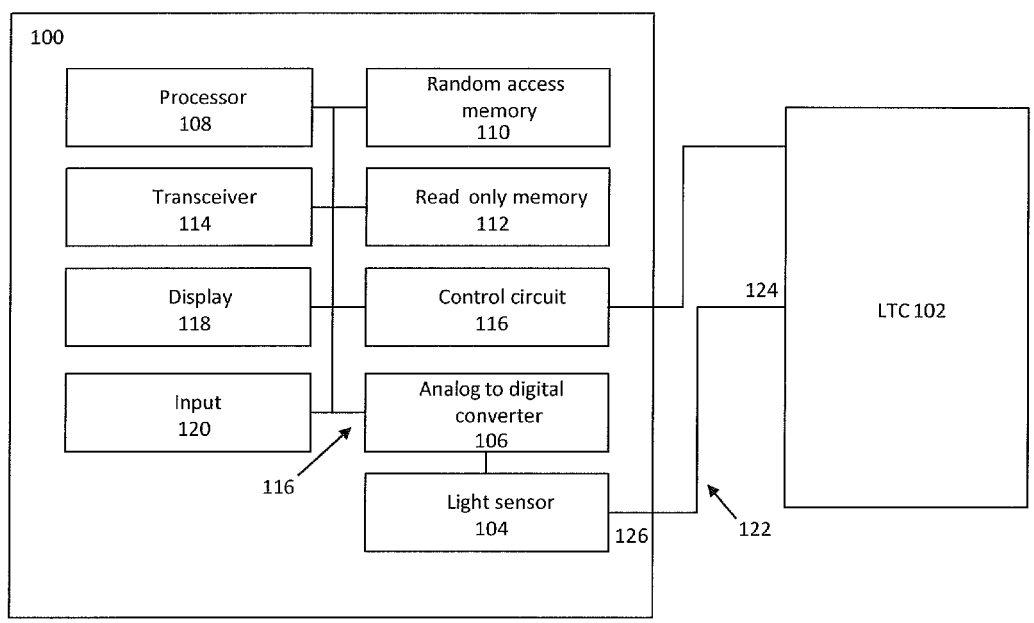
FIG. 1 is a schematic view of a system for monitoring electrical arcs in switchgear according to aspects of the present disclosure.

The invention will now be described with reference to the drawing figures, in which like reference numerals refer to like parts throughout. An embodiment in accordance with the present invention provides for a device that can detect electrical arcs in electrical switching devices that utilize vacuum interrupters. "Switched current" is intended to encompass a prospective current that is to be broken during a switching operation by each set of main switching or transition contacts or vacuum interrupters (including, for example, resistance-type LTC) incorporated in the arcing switch or arcing tap switch. "Transition contacts" are intended to encompass one or a set of contacts that can be connected to a series with a transition impedance to make and break current. "Transition impedance" is intended to encompass one or more reactors consisting of one or more units that can bridge adjacent taps for the purpose of transferring load from one tap to the other without interruption or appreciable change in the load current, at the same time limiting the circulating current for the period that both taps can be used. Generally, reactance-type LTCs, for example, use the bridging position as a service position, and, therefore, the reactor can be designed for continuous loading.

Reference in this specification to "one aspect," "an aspect," "other aspects," "one or more aspects" or the like means that a particular feature, structure, or characteristic described in connection with the aspect is included in at least one aspect of the disclosure. The appearances of, for example, the phrase "in one aspect" in various places in the specification are not necessarily all referring to the same aspect, nor are separate or alternative aspects mutually exclusive of other aspects. Moreover, various features are described which may be exhibited by some aspects and not by others. Similarly, various requirements are described which may be requirements for some aspects but not for other aspects.

An electric arc is an electrical breakdown of a dielectric fluid which produces an ongoing plasma discharge, resulting from a current through normally nonconductive material. This invention is related to the development of a resistance bridging load tap changer (LTC) that utilizes vacuum interrupters to accomplish the switching operation in a vacuum instead of the usual arcing under oil.

More specifically, the disclosure provides for a system that can detect that an electrical arc occurred outside of a vacuum interrupter during an electrical switching event. In normal operation, the electrical arc is contained within the vacuum interrupter and is not visible. Any malfunction in the vacuum interruption system while switching may cause a visible electrical arc. The unintended arcing degrades insulating oil quality, melts or vaporizes contacts, and leads eventually to switch failure. The result is costly unit failure.

Generally and according to some aspects, a light sensing system (e.g., a combination of one or more point sensors and fiber optic cable) may detect visible electrical arc(s) in the switching device and communicate with an electrical control device to signal the occurrence of an unintended electrical arc. The signal transmitted by the control device may include but it is not limited to one or more of: an alarm signal, limiting further switch operation, and disabling switch operation. The type of signal may depend on a severity of the arcing, the frequency of the unintended arcing, and the such.

Referring now to FIG. 1, a schematic view of a system for monitoring electrical arcs in switchgear is depicted. In particular, FIG. 1 shows a system 100 detecting electrical arcs in switchgear such as load tap changers. In particular, a load tap changer 102 may be monitored by the system 100. A fiber-optic cable 122 may be arranged such that it has an input end 124 located in, around, or the like with respect to the load tap changer 102 adjacent the location of a possible electrical arc. The fiber-optic cable 122 may also has an output end 126 arranged adjacent a light sensor 104. The light sensor 104 may take any form and can include light sensors as a charge coupled device.

When there is an electrical arc in the load tap changer 102, the input end 124 of the fiber-optic cable 122 may receive the light emitted from the electrical arc and transmit the light to the output end 126 adjacent to the light sensor 104. Thereafter the light sensor 104 may receive the light and generate an electrical signal in response thereto.

The electrical signal from the light sensor 104 may be received by an analog to digital converter 106. The analog-to-digital converter 106 will convert the analog signal from the light sensor 14 into a digital signal and place the digital signal onto a bus 116 of the system 100. Of course it should be noted that the light emitted from the load tap changer 102 may vary in intensity, duration, and the like and the sensor 104 may detect these features for conversion by the analog-to-digital converter 104 into a digital signal.

The system 100 may further include a processor 108 such as a microprocessor, application-specific integrated circuit, or the like for operating the system 100. The processor 108 may be connected to the bus 116 for the transfer of data to the other components of the system 100. The system are may further include a random access memory 110 and a read-only memory 112. The memories 110, 112 may store programs to operate the system 100, may store values associated with the electrical arcs sensed by the system 100 and/or predetermined thresholds that can be used to differentiate the unintended arcs that can cause components system to fail. The system 100 may further include a display device 118 to allow a user or technician to view data associated with the system 100. Additionally, the system 100 may further include an input device such as a keypad, a keyboard, mouse, touch screen, and the like.

In operation, the processor 108 may cooperate with the analog-to-digital converter 16 to determine whether an electrical arc has been detected from the load tap changer 102. Furthermore, the processor 108 may obtain and store in the memory 110, 112 the intensity of the electrical arc, the length of time the electrical arc exists, the day and time that the electrical arc was sensed, and the like (related information).

The system 100 may further include a transceiver 114 that operates to transmit wirelessly or wired in any number of different communication channels. In particular, the transceiver 114 may communicate the occurrence of the electrical arc and related information. The transceiver 114 may also receive instructions from a central monitoring location in order to take action with respect to the load tap changer 102. In some embodiments, for example, the transceiver 114 can be used to provide communication between the system 100 and offsite site where a power grid can be monitored by service providers and/or manufacturers.

The system 100 may further include a control circuit 116. The control circuit 116 may, in response to instructions from the processor 108, instructions received through the transceiver 114, instructions from the input 120, or the like, provide control signals to adjust the operation of the load tap changer 102. In this regard, the control circuit 116 may limit the operation, start operation, stop operation, or the like, of the load tap changer 102. For example, the tap changer 102 may begin a arcing tap switch (tap selector switch) or a reversing change-over selector (reversing switch) to limit or regulate the current and prevent the system from complete bottle system failure.

Accordingly, the monitoring system of the invention protects the equipment and system in the unlikely event of a bottle system failure. As noted above, the unintended arcing degrades insulating oil quality, melts or vaporizes contacts, and leads eventually to switch failure. The result is costly unit failure. Power companies have high reliability standards and do not want interruption of the power distribution network. Customers have expectations that electrical power is always available. In some embodiments, the distribution system reliability can also be monitored by governmental agencies and citizen boards. An undetected failure in the vacuum switching system could result in a LTC failure or even a transformer failure. These types of failures would be costly to our power companies in lost equipment, lost revenue, and lost reputation. The monitoring system can monitor and be used to troubleshoot the system by identifying significant unintended arcing signals and providing a corresponding timely warning for timely correction to take place.

Figure 2:
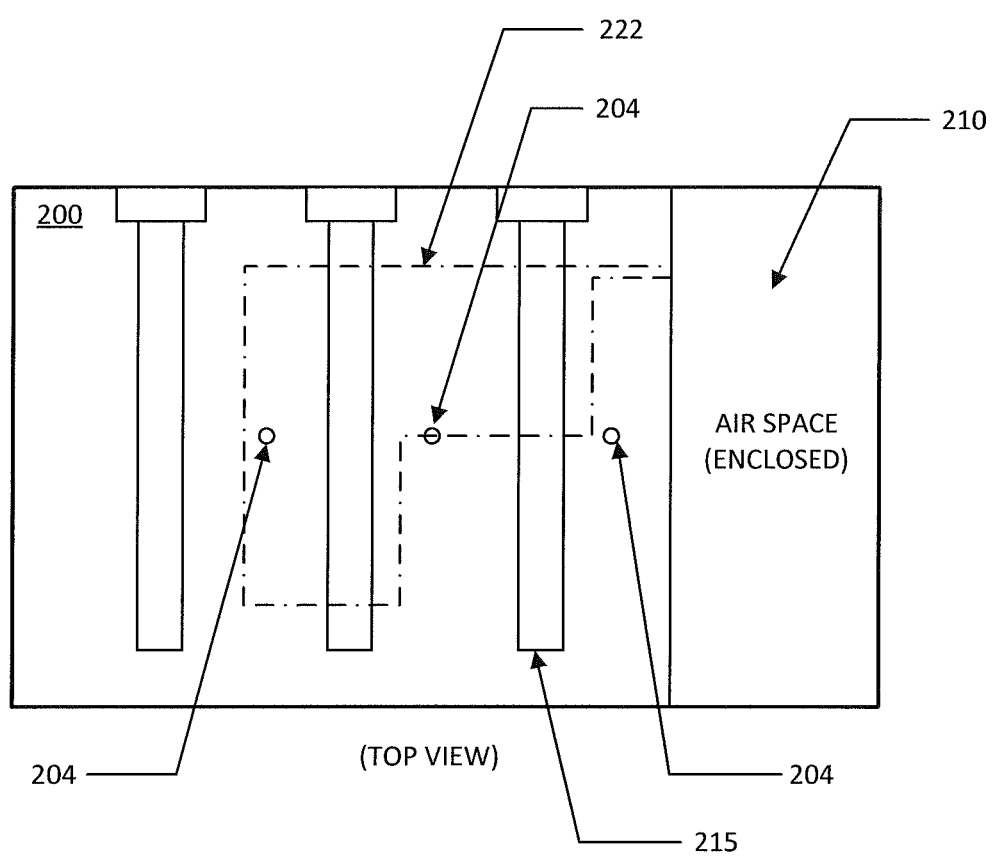
FIG. 2 is the top view of an exemplary Load Tap Changer (LTC) including the system for monitoring electrical arcs according to aspects of the present disclosure.

Referring to FIG. 2, the top view of an exemplary LTC including the system for monitoring electrical arcs according to aspects of the present disclosure is depicted. In particular, the electrical switching system 100 being a LTC utilizing vacuum interrupters 215 contained in an oil compartment 200. In the present exemplary embodiment, three vacuum interrupters 215 are contained in the oil compartment. However, any number of vacuum interrupters 215 may be included in the electrical switching system 100 and will be in scope of the present disclosure.

In addition to the oil compartment 200, a tank air filled compartment 320 (shown in FIG. 3) and enclosed air space 210 may be included in the LTC. In addition to conventional components including the drive, flywheel, gearing, motor, cabinet, controls, accessories, wiring and connections, driving mechanism, and the such, included in either or both the air tank filled compartment 320 or the enclosed air space 210, a controller 315 (shown in FIG. 3) for the light sensing system may be included according to aspects of the present disclosure.

The light sensing system may include, for example, one or more point sensors 204 and fiber optic 222 arranged to be exposed around areas the vacuum interrupters 215. As depicted, it may be desired to include a point sensor 204 in proximity to a fiber optic cable loop 222 and each of the vacuum interrupters 215 so that the light sensing system may identify and can correlate an unintended arc to the particular vacuum interrupter 215 that caused it. The fiber optic cable loop 222 can serve to help detect light from the arc flash over the entire length of the fiber optic cable loop 222, including confined areas, to reduce hazardous or damage to the electrical switching system 100 without delay. In some preferred embodiments, the fiber optic cable loop 222 and fiber optic point sensors 204 may be treated so that it can be submerged inside the insulating fluid, i.e., insulating oil, and around the vacuum interrupters 215 to achieve greater sensitivity to arcing and improve the response time of the detection system. In yet additional embodiments, one or more of the point sensors 204 may be attached to the side walls of the back wall of the vacuum interrupters 215 and in communication with other sensors and/or the controller 315 to produce synchronized measurements of optical sensor levels, current inputs, and/or arc-flash relay trip operation, to provide a system with increased reliability in actual arc-flash conditions.

In yet additional embodiments, one or combinations of synchronized flash detection technologies including, multi-spectrum IR, ultraviolet/infrared, dual spectrum IR, and/or single frequency IR may be implemented depending on the application and according to aspects of the present disclosure. Other applications can include but are not limited to power regulation in automotive, compressors, hydrogen stations, loading systems, electrostatic painting, gas cabinets, hydrogen, metal fab, and oil pipeline applications.

Figure 3:
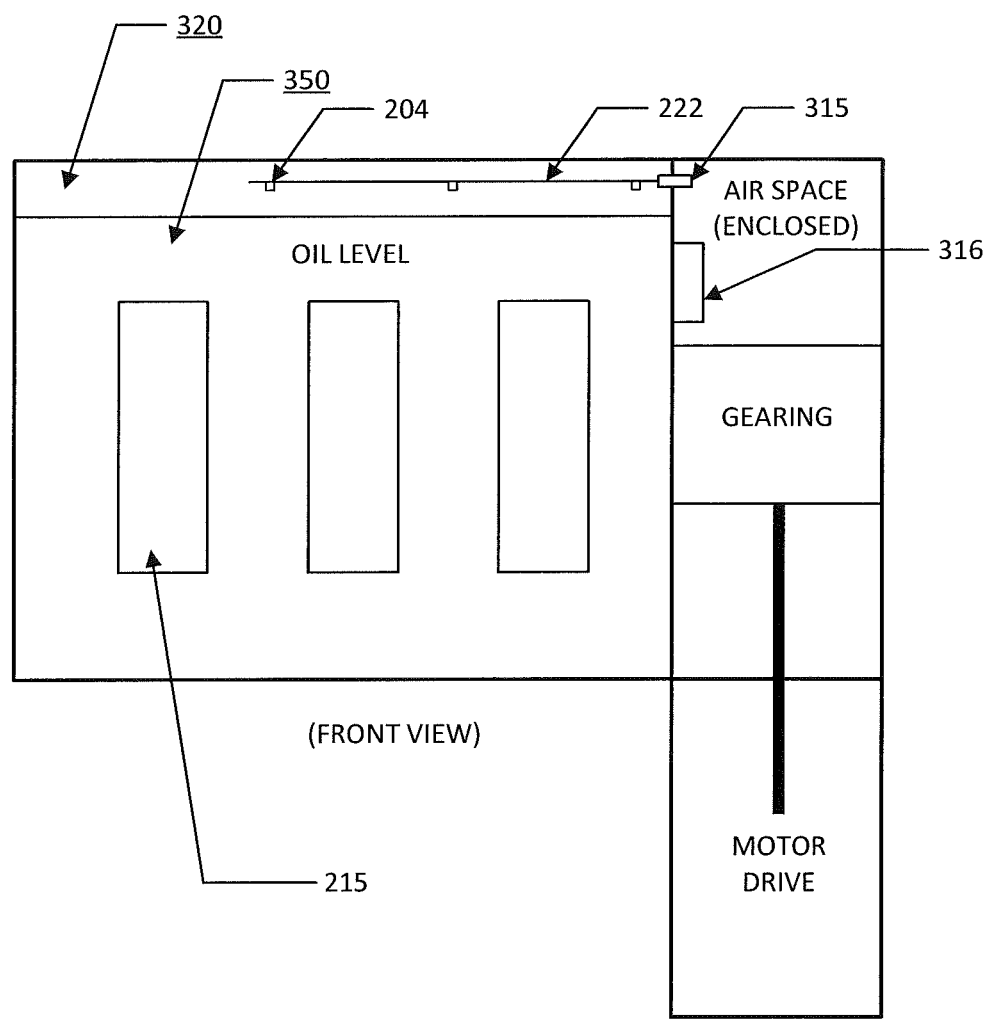
FIG. 3 is the front view of the exemplary Load Tap Changer of FIG. 2 including the system for monitoring electrical arcs according to aspects of the present disclosure.

Referring now to FIG. 3, the front view of the exemplary Load Tap Changer of FIG. 2 including the system for monitoring electrical arcs according to aspects of the present disclosure is depicted. In particular, the front view of the LTP shows how the fiber optic cable 222 and sensors 204 can be located above the insulating fluid 305, e.g. insulating oil, to function as previously described. In more sensitive detection systems, as previously mentioned, at least some of the fiber optic cable 222 and point sensors 204 may be treated to be immersed inside of the insulating fluid 305 and synchronized with other sensor components for increased sensitivity and reliability of the system 100.

Accordingly, the point sensors 204 and fiber optic tube loop can be in communication with each other and/or with a controller 315 which may be contained in the air enclosed space having other control systems and/or motor drive parts 316. Said other controller systems for motor drive parts, gearing, and motor drive may also be in logical communication with controller 315. For example, when the controller 315 transmits a signal to the control system 316, the motor drive, gearing, and the such, may be adjusted accordingly to prevent greater risk to failure. The signal may identify the vacuum interrupter 215 causing the unintended arcing, the magnitude of the arcing, the frequency in which is occurring, and the such, to cause a predetermined action that can warn of risk, reduce failure risk, and/or fix the problem. As it will be apparent to those skilled in the art, in some embodiments the controller 315 of the detection system may be integrated or form part of the system control 316. Accordingly, the present disclosure is not limited by the number of processors, controllers, and/or sensors that operate to detect the unintended arcs produced by vacuum interrupters 215 as described herein.

Figure 4:
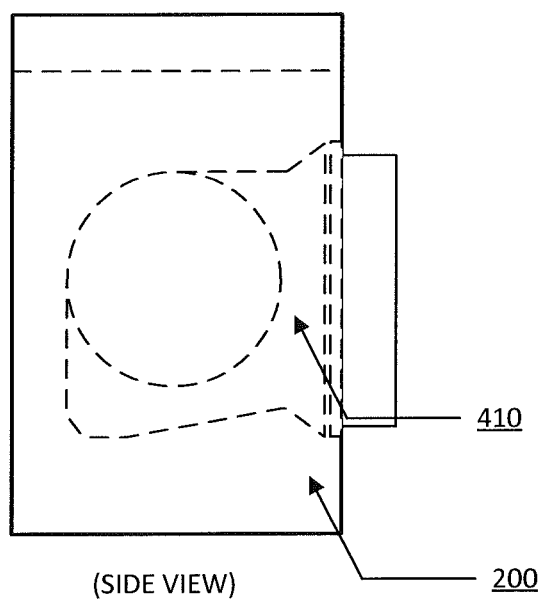
FIG. 4 is the side view of the exemplary Load Tap Changer of FIGS. 2 and 3 including the system for monitoring electrical arcs according to aspects of the present disclosure.

Referring now to FIG. 4, the side view 200 of the exemplary Load Tap Changer of FIGS. 2 and 3 including the system for monitoring electrical arcs according to aspects of the present disclosure is depicted. In particular, FIG. 4 depicts a switch 410 which may rotate clockwise or counterclockwise to adjust voltage according to the operation of the switching system 100 and a signal sent by the detection system of the present disclosure.

Figure 5:
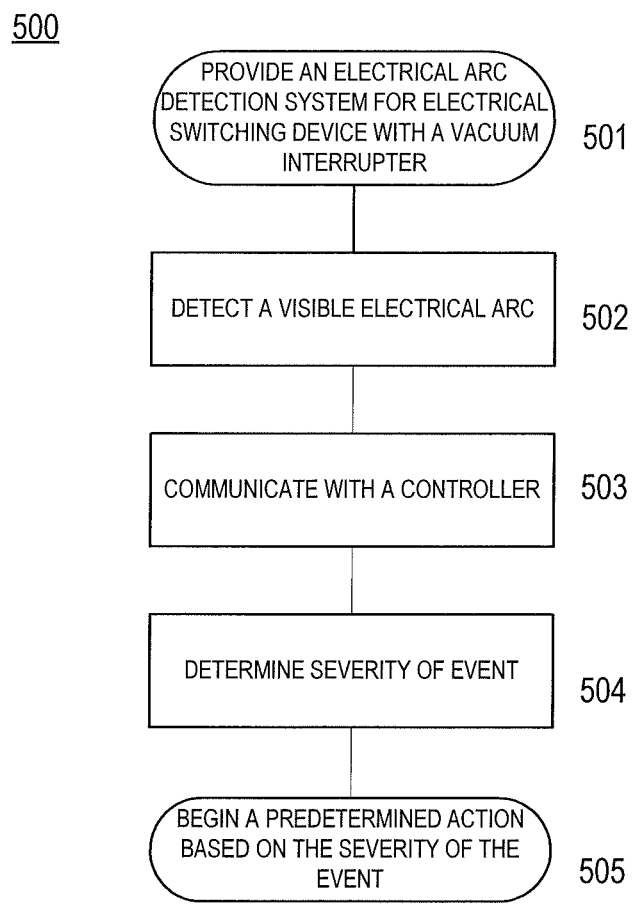
FIG. 5 is a flowchart illustrating exemplary method steps that may be implemented for arc monitoring according to aspects of the present disclosure.

Referring not to FIG. 5, a flowchart 500 illustrating exemplary method steps that may be implemented for arc monitoring according to aspects of the present disclosure are shown. Beginning at step 501, an electrical arc detection system is provided in an electrical switching system. At step 502, the arc detection system is configured to detect a visible electrical arc. Upon detection communication with a control device can occur at step 503. The control device may include a number of predetermined parameters and/or thresholds to determine when arcing is unintended, significant, and requires a modification in the system. In some embodiments, the detected arcing can be recorded to measure the frequency in which the unintended arcing occurs, as some low frequency arcing may be ok in some systems/applications. In additional embodiments, the system may correlate the arcing to other factors such as temperature changes, integrated systems failures, manual manipulation of the system, test protocols, and the such. According to the gathered data, prerecorded thresholds and/or events, at step 504, the controller may determine the severity of an isolated event or combinations of lower magnitude events to determine when degradation of oil quality and/or melting or vaporization of contacts may eventually lead to switch failure.

At step 505, a predetermined action based on the severity of the event determination may occur. The predetermined action may include, for example, to one or more of: transmitting an alarm signal, limiting switch operation, disabling switch operation and the like. In some embodiments, the system may include communication channels that may be any type of wired or wireless electronic communications network, such as, e.g., a wired/wireless local area network (LAN), a wired/wireless personal area network (PAN), a wired/wireless home area network (HAN), a wired/wireless wide area network (WAN), a campus network, a metropolitan network, an enterprise private network, a virtual private network (VPN), an internetwork, a backbone network (BBN), a global area network (GAN), the Internet, an intranet, an extranet, an overlay network, a cellular telephone network, a Personal Communications Service (PCS), using known protocols such as the Global System for Mobile Communications (GSM), CDMA (Code-Division Multiple Access), W-CDMA (Wideband Code-Division Multiple Access), Wireless Fidelity (Wi-Fi), Bluetooth, and/or the like, and/or a combination of two or more thereof.

The invention may be implemented in any type of computing devices, such as, e.g., a desktop computer, personal computer, a laptop/mobile computer, a personal data assistant (PDA), a mobile phone, a tablet computer, cloud computing device, and the like, with wired/wireless communications capabilities via the communication channels.

In an exemplary embodiment, the invention may be web-based. For example, a server may operate a web application to allow the invention to operate in conjunction with a database. The web application may be hosted in a browser-controlled environment (e.g., a Java applet and/or the like), coded in a browser-supported language (e.g., JavaScript combined with a browser-rendered markup language (e.g., Hyper Text Markup Language (HTML) and/or the like)) and/or the like such that any computer running a common web browser (e.g., Internet Explorer™, Firefox™, Chrome™, Safari™ or the like) may render the application executable. A web-based service may be more beneficial due to the ubiquity of web browsers and the convenience of using a web browser as a client (i.e., thin client). Further, with inherent support for cross-platform compatibility, the web application may be maintained and updated without distributing and installing software on each.

In an embodiment, the invention may be implemented in any type of mobile smartphones that are operated by any type of advanced mobile data processing and communication operating system, such as, e.g., an Apple™ iOS™ operating system, a Google™ Android™ operating system, a RIM™ Blackberry™ operating system, a Nokia™ Symbian™ operating system, a Microsoft™ Windows Mobile™ operating system, a Microsoft™ Windows Phone™ operating system, a Linux™ operating system or the like.

Further in accordance with various embodiments of the invention, the methods disclosed herein can be used for operation with dedicated hardware implementations including, but not limited to, PCs, PDAs, semiconductors, application specific integrated circuits (ASIC), programmable logic arrays, cloud computing devices, and other hardware devices constructed to implement the methods described herein.

It should also be noted that the software implementations of the invention as described herein are optionally stored on a tangible storage medium, such as: a magnetic medium such as a disk or tape; a magneto-optical or optical medium such as a disk; or a solid state medium such as a memory card or other package that houses one or more read-only (non-volatile) memories, random access memories, or other re-writable (volatile) memories. A digital file attachment to email or other self-contained information archive or set of archives is considered a distribution medium equivalent to a tangible storage medium. Accordingly, the invention is considered to include a tangible storage medium or distribution medium, as listed herein and including art-recognized equivalents and successor media, in which the software implementations herein are stored.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents may be resorted to that fall within the scope of the invention.

What is claimed is:

1. An electrical arc detection system for switchgear, the electrical arc detection system comprising:
    a fiber-optic cable positioned to receive light emitted by a vacuum interrupter towards an insulating fluid in which the vacuum interrupter is immersed, wherein;

the light emission results from arcing of the vacuum interrupter and it is received by a section of the fiber-optic cable that is proximate to the light emission; and the section of the fiber-optic cable receiving the light emission carrying the light towards one or more sensors in communication with a processor;

the one or more sensors configured to sense the light and generate an electrical signal;

an analog-to-digital converter configured to convert the electrical signal to a digital signal; and the processor configured to receive the signal and, based on the digital signal, at least one of transmit information related to the digital signal, store information related to the digital signal, and take action based on the digital signal.

2. The electrical arc detector of claim 1, wherein the fiber optic cable is positioned above an insulating fluid level.

3. The electrical arc detector of claim 1, wherein at least one of the one or more sensors is in communication with the processor and at least a portion of the fiber optic cable is submersed in the insulating fluid and positioned in proximity to the vacuum interrupter.

4. The electrical arc detector of claim 3, wherein more than one vacuum interrupter is included in the system for switchgear.

5. The electrical arc detector of claim 4, wherein at least some of the one or more sensors are synchronized with the processor and with each other.

6. The electrical arc detector of claim 1, wherein the processor is configured to be in communication with a database including predetermined thresholds.

7. The electrical arc detector of claim 6, wherein the action is based on the signal after it is compared to the predetermined thresholds.

8. The electrical arc detector of claim 7, wherein the action includes one or more of transmitting an alarm signal, limiting switch operation, and disabling switch operation.

9. The electrical arc detector of claim 1, additionally comprising a transceiver configured with the processor to transmit a warning signal to a computing device regarding an operating condition of the switchgear system.

10. The electrical arc detection of claim 1, additionally comprising a display configured with the processor to display one or more messages regarding an operating condition of the switchgear system.

11. An electrical arc detection process for switchgear, the electrical arc detection process comprising:

positioning a fiber-optic cable to receive light emitted by a vacuum interrupter towards an insulating fluid in which the vacuum interrupter is immersed, wherein;

the light emission results from arcing of the vacuum interrupter and it is received by a section of the fiber-optic cable that is proximate to the light emission; and the section of the fiber-optic cable receiving the light emission carrying the light towards one or more sensors in communication with a processor;

configuring the one or more sensors to sense the light and generate an electrical signal;

converting the electrical signal to a digital signal with an analog-to-digital converter; and configuring the processor to receive the signal and, based on the digital signal, at least one of transmitting information related to the digital signal, story information related to the digital signal, and taking action based on the digital signal.

12. The electrical arc detector process of claim 11, wherein the fiber optic cable is positioned above an insulating fluid level.

13. The electrical arc detector process of claim 11, further comprising communicating by at least one of the one or more sensors with the processor and at least a portion of the fiber optic cable are submersed in the insulating fluid and positioned in proximity to the vacuum interrupter.

14. The electrical arc detector process of claim 13, wherein more than one vacuum interrupter is included in the system for switchgear.

15. The electrical arc detector process of claim 14, further comprising synchronizing at least some of the one or more sensors with the processor and with each other.

16. The electrical arc detector process of claim 11, wherein the processor is configured to be in communication with a database including predetermined thresholds.

17. The electrical arc detector process of claim 16, wherein the action is based on the signal after it is compared to the predetermined thresholds.

18. The electrical arc detector process of claim 17, wherein the action can include one or more of transmitting an alarm signal, limiting switch operation, and disabling switch operation.

19. The electrical arc detector process of claim 11, additionally comprising providing a transceiver with the processor to transmit a warning signal to a computing device regarding an operating condition of the switchgear system.

20. The electrical arc detection process of claim 11, additionally comprising displaying with a display, responsive to the processor, to display one or more messages regarding an operating condition of the switchgear system.

* * * * *